(12) United States Patent
Plett

(10) Patent No.: US 8,041,522 B2
(45) Date of Patent: Oct. 18, 2011

(54) SYSTEM AND METHOD FOR RECURSIVELY ESTIMATING BATTERY CELL TOTAL CAPACITY

(75) Inventor: Gregory L. Plett, Colorado Springs, CO (US)

(73) Assignee: American Electric Vehicles, Ind., Palmer Lake, CO (US)

( * ) Notice: Subject to any disclaimer, the term of this patent is extended or adjusted under 35 U.S.C. 154(b) by 0 days.

(21) Appl. No.: 12/956,922

(22) Filed: Nov. 30, 2010

(65) Prior Publication Data

US 2011/0130985 A1    Jun. 2, 2011

Related U.S. Application Data

(60) Provisional application No. 61/283,329, filed on Dec. 2, 2009.

(51) Int. Cl.
*G01R 31/36* (2006.01)
(52) U.S. Cl. .......................................................... 702/63
(58) Field of Classification Search ...................... 702/63
See application file for complete search history.

(56) References Cited

U.S. PATENT DOCUMENTS

| | | | |
|---|---|---|---|
| 5,789,924 A | 8/1998 | Okada | |
| 6,534,954 B1 | 3/2003 | Plett | |
| 6,892,148 B2 | 5/2005 | Barsoukov et al. | |
| 7,315,789 B2 | 1/2008 | Plett | |
| 7,321,220 B2 | 1/2008 | Plett | |
| 7,324,902 B2 * | 1/2008 | Verbrugge et al. | 702/64 |
| 7,400,115 B2 | 7/2008 | Plett | |
| 7,446,504 B2 | 11/2008 | Plett | |
| 7,521,895 B2 | 4/2009 | Plett | |
| 7,525,285 B2 | 4/2009 | Plett | |
| 7,589,532 B2 | 9/2009 | Plett | |
| 7,593,821 B2 | 9/2009 | Plett | |
| 7,656,122 B2 | 2/2010 | Plett | |
| 7,656,123 B2 | 2/2010 | Plett | |
| 7,723,957 B2 | 5/2010 | Plett | |
| 7,800,375 B2 | 9/2010 | Plett | |
| 7,884,613 B2 | 2/2011 | Plett | |
| 7,893,694 B2 | 2/2011 | Plett | |
| 2006/0100833 A1 | 5/2006 | Plett | |
| 2007/0029973 A1 * | 2/2007 | Ashizawa et al. | 320/132 |

(Continued)

OTHER PUBLICATIONS

Moore et al., A Review of Cell Equalization Methods for Lithium Ion and Lithium Polymer Battery Systems, 2001 Society of Automotive Engineers, Inc.

(Continued)

*Primary Examiner* — Michael Nghiem
(74) *Attorney, Agent, or Firm* — McDonnell Boehnen Hulbert & Berghoff

(57) ABSTRACT

A system and method for determining an estimated battery cell total capacity indicative of a total capacity of a battery cell is provided. The method includes receiving a first battery cell state-of-charge estimate at a first time and receiving a second battery cell state-of-charge estimate at a second time subsequent to the first time, measuring an integrated battery cell current value indicative of the integrated battery cell current between the first time and the second time, updating at least one recursive parameter based on the first battery cell state-of-charge estimate, the second battery cell state-of-charge estimate, and the integrated battery cell current value, determining the estimated battery cell total capacity based on at least one recursive parameter, and storing a value corresponding to the estimated battery cell total capacity in a memory.

12 Claims, 4 Drawing Sheets

U.S. PATENT DOCUMENTS

| | | | |
|---|---|---|---|
| 2008/0249725 A1 | 10/2008 | Plett | |
| 2009/0189613 A1 | 7/2009 | Plett | |
| 2010/0138178 A1* | 6/2010 | Paryani et al. | 702/63 |
| 2010/0174500 A1 | 7/2010 | Plett | |
| 2010/0191491 A1* | 7/2010 | Plett | 702/63 |

OTHER PUBLICATIONS

Plett, Gregory L., "Recursive Approximate Weighted Total Least Squares Estimation of Battery Cell Total Capacity," Journal of Power Sources 196 (2011) 2319-31.

Plett, Gregory L., "Battery Management System Algorithms for HEV battery state-of-charge and state-of-health estimation," Advanced Materials and Methods for Lithium-Ion Batteries, 2007.

Plett, Gregory L., Sigma-point Kalman filtering for battery management systems of LiPB-based HEV battery packs Part 1: Introduction and state estimation, 2006.

Plett, Gregory L., "Sigma-point Kalman filtering for battery management systems of LiPB-based HEV battery packs Part 2: Simultaneous state and parameter estimation" Journal of Power Sources 161 (2006) 1369-84.

Plett, Gregory L., "High-Performance Battery-Pack Power Estimation Using a Dynamic Cell Model," IEEE Transactions on Vehicular Technology, vol. 53, No. 5, Sep. 2004.

Plett, Gregory L., Extended Kalman filtering for battery managment systems of LiPB-based HEV battery packs Part 1. Background, Journal of Power Sources 134 (2004) 252-261.

Plett, Gregory L., "Extended Kalman filtering for battery management systems of LiPB-based HEV battery packs Part 2. Modeling and identification" Journal of Power Sources 134 (2004) 262-276.

Plett, Gregory L., "Extended Kalman filtering for battery management systems of LiPB-based HEV battery packs Part 3. State and parameter estimation" Journal of Power Sources 134 (2004) 277-292.

* cited by examiner

US 8,041,522 B2

SYSTEM AND METHOD FOR RECURSIVELY ESTIMATING BATTERY CELL TOTAL CAPACITY

RELATED APPLICATIONS

This applications claims priority to U.S. Provisional Application Ser. No. 61/283,329 filed Dec. 2, 2009, the disclosure of which is hereby incorporated by reference.

FIELD OF THE APPLICATION

This application relates generally to battery cells that can be used in electric vehicles, and more particularly to a method and system for recursively estimating battery cell capacity.

BACKGROUND

Battery cells are used in a wide variety of electronic and electrical devices. In these applications it is often desirable to be able to ascertain the present "health" of a battery cell. One measure of battery cell health is its total capacity, which is the maximum amount of charge that the cell can hold, and is usually measured in ampere hours (Ah) or milliampere hours (mAh). As a battery cell ages, its total capacity tends to decrease. Therefore, it is desirable to be able to estimate the present value of battery cell total capacity.

A number of algorithms have been proposed for the purpose of battery cell total capacity estimation. Very often, there is a tradeoff between the complexity of the algorithm and the operational constraints imposed by the algorithm and the accuracy of the results that it produces. Very accurate results tend to be produced only by very complex algorithms (which require extensive processor resources to execute) or those that impose operational constraints on how the battery is used. Accurate results at a lower complexity and with fewer constraints are desirable.

Accordingly, the inventor herein has recognized a need for an improved method for more efficiently determining an estimated battery cell total capacity. The embodiments disclosed herein impose fewer operational constraints, and requires very little processing to provide accurate estimates of cell total capacity.

BRIEF DESCRIPTION OF THE EMBODIMENTS

A method for determining an estimated battery cell total capacity indicative of a total capacity of a battery cell in accordance with an exemplary embodiment is provided. The method includes receiving a first battery cell state-of-charge estimate at a first time, receiving a second battery cell state-of-charge estimate at a second time subsequent to the first time, and measuring an integrated battery cell current between the first and second times. The method further includes computing updating at least one recursive parameter based on the first battery cell state-or-charge estimate, the second battery cell state-of-charge estimate, and the integrated battery cell current. The method further includes determining an to estimated battery cell total capacity based on at least one recursive parameter and storing a value corresponding to the estimated battery cell total capacity in a memory.

A system for determining an estimated battery cell total capacity indicative of a total capacity of a battery cell in accordance with an exemplary embodiment is provided. The system includes a first subsystem configured to receive a first state-of-charge estimate at a first time, and a second subsystem configured to receive a second state-of-charge estimate at a second time subsequent to the first time. The system further includes a current sensor electrically coupled to the battery cell. The current sensor is configured to generate a signal indicative of an integrated battery cell current between the first and second times. The system further includes a computer comprising the first subsystem, the second subsystem, and a subsystem configured to receive the integrated current signal. The computer is further configured to update at least one recursive parameter based on the first state-of-charge estimate, the second state-of-charge estimate, and the integrated current signal. The computer is further configured to determine the estimated battery cell total capacity based on at least one recursive parameter and to store a value corresponding to the estimated battery cell total capacity in a memory.

A computer readable medium having computer-executable instructions for performing a method for determining an estimated battery cell total capacity indicative of a total capacity of a battery cell in accordance with an exemplary embodiment is provided. The method includes receiving a first state-of-charge estimate at a first time, receiving a second state-of-charge estimate at a second time subsequent to the first time, measuring an integrated battery cell current between the first and second time, updating at least one recursive parameter based on the first state-of-charge estimate, the second state-of-charge estimate, and the integrated battery cell current, and determining the estimated battery cell total capacity based on at least one recursive parameter. The method further includes storing a value corresponding to the estimated battery cell total capacity in a memory.

DETAILED DESCRIPTION

Figure 1:
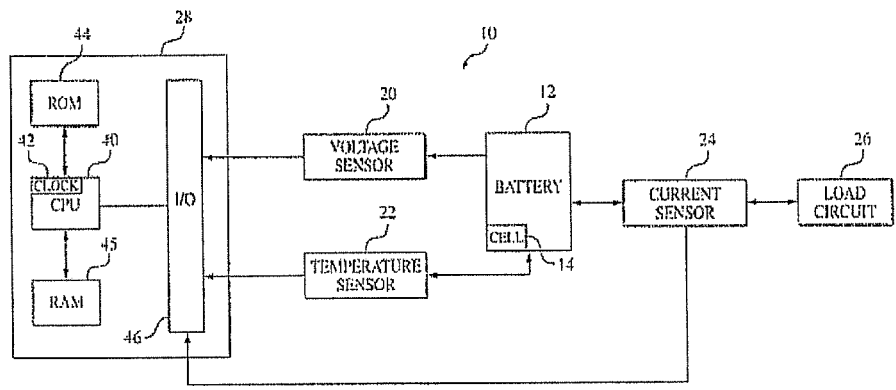
FIG. 1 is a schematic of a system for determining an estimated battery cell total capacity and available energy in accordance with an exemplary embodiment.

The total capacity of a battery cell is a value, usually expressed in ampere hours (Ah) or milliampere hours (mAh), that indicates the maximum electrical charge that the battery cell is capable of holding. New battery cells are manufactured with certain nominal total capacities, but as the cells age, their capacities generally decrease. Therefore, being able to accurately estimate the total capacity of a battery cell is important to being able to determine the health of that battery cell.

The state-of-charge (SOC) of a battery cell is a value between 0% and 100% that indicates the relative level of charge presently held by the battery cell. A state-of-charge of 100% corresponds to a "full" cell, while a state-of-charge of 0% corresponds to an "empty" cell. State-of-charge is sometimes referred to as "residual capacity" and is not to be confused with the battery cell total capacity. However, the two are related by the equation $$z(t_2) = z(t_1) + \frac{1}{C}\int_{t_1}^{t_2} \eta i(t)\,dt \qquad (1)$$

where $z(t_2)$ is the battery cell SOC at time $t_2$, $z(t_1)$ is the battery cell SOC at time $t_1$, C is the battery cell total capacity, i(t) is the battery cell current at time t, in amperes, and $\eta$ is a unitless efficiency factor, which may take on different values depending on whether the current is positive or negative. SOC itself is unitless. Note that in the convention used herein, discharge current is assumed to have a negative sign and charge current is assumed to have a positive sign. The opposite convention may be used with very simple changes to the equations, and the disclosed embodiment applies to that case as well.

Equation (1) is the mathematical basis for most capacity estimating methods. The terms can be rearranged to get:

$$C = \frac{1}{z(t_2) - z(t_1)}\int_{t_1}^{t_2} \eta i(t)\,dt \text{ or } \int_{t_1}^{t_2} \eta i(t)\,dt = C(z(t_2) - z(t_1)) \qquad (2)$$

Using a regression technique, one may compute estimates of C, especially using the second for, where the obvious linear structure of y=Cx becomes apparent. One only needs values for "x" and "y".

The problem with using standard (least squares) linear regression techniques is that both the integrated current value y and the difference between state-of-charge values x have sensor noise or estimation noise associated with them. The least squares linear regression problem is a solution to the equation $(y+\Delta y)=Cx$: that is, there is noise assumed on the measurements y, but not on the independent variable x. However, Equation (2) is implicitly of the form $(y+\Delta y)=C(x+\Delta x)$ since both the integrated current and SOC estimates have noise. That is, because estimates of SOC are generally imperfect, there will be noise on the x variable, and using standard least squares linear regression results in an inaccurate and biased estimate of battery cell total capacity.

The usual approach to counteract this problem is to try to ensure that the SOC estimates are as accurate as possible and then use standard least squares estimation anyway. For example, U.S. Pat. No. 6,892,148 puts constraints on how the capacity is estimated. It forces the cell current to be zero before the test begins (so that the cell is in an equilibrium state and the first SOC estimate is accurate) and similarly forces the cell current to be zero after the test ends (again, so that the cell is in an equilibrium state and the second SOC estimate is accurate). This procedure eliminates to a large extent (but not completely) the error in the x variable, and makes the regression reasonably accurate. A second example is U.S. Pat. No. 5,789,924, where battery current is periodically interrupted and a test performed to estimate the cell resistance so that the ongoing SOC estimates may be corrected for ohmic voltage losses. Again, the basic idea is to try to make x as noise-free as possible.

Both of these methods require a very structured and invasive setting for determining battery cell total capacity. The battery cell current must be controlled by the algorithm. Furthermore, neither one correctly handles the residual noise in x (while they minimize the noise, they never totally eliminate it). What is needed is a method for determining battery cell total capacity in a non-invasive setting where the method does not impose constraints on the battery cell current, and where noise in the SOC estimates is correctly accounted for. The system and method disclosed herein may be used to determine an accurate estimated battery cell total capacity in a computationally efficient manner, without imposing constraints on the battery cell current.

An overview of the method for estimating a battery cell total capacity will now be described. Referring to FIG. 1, the computer 28 receives a first state-of-charge estimate corresponding to a cell state-of-charge at a first time, and receives a second state-of-charge estimate corresponding to the cell state-of-charge at a second time. These estimates may be received from a subsystem within the computer configured to produce such estimates, or from some external source. The system 10 measures an integrated battery cell current between the first and second times. The computer 28 updates at least one recursive parameter based on the first state-of-charge estimate, the second state-of-charge estimate, and the integrated battery cell current. Further, the computer 28 determines an estimated battery cell total capacity based on at least one recursive parameter and stores a value corresponding to the estimated battery cell total capacity in the memory 45.

Figure 2:
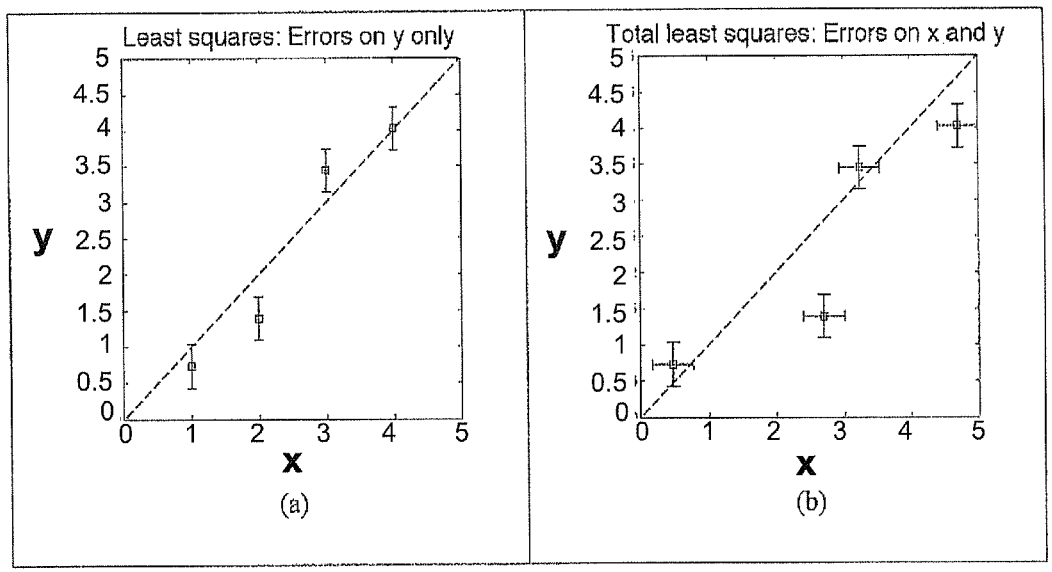
FIG. 2 illustrates the different objectives behind "least squares" regression and "total least squares" regression.

To further understand the deficiency of the methods used in the state of the art, consider FIG. 2. FIG. 2(a) illustrates the standard assumptions used when using least-squares linear regression to fit a straight line to data. Sample data points are drawn as squares, and error bars indicating one standard deviation of measurement error are drawn as well. The x component of the data is assumed to have no measurement error, so the line is fit to minimize the sum of squares of all vertical distances between measured points and the regression line itself.

FIG. 2(b) illustrates the correct way to use regression to fit a straight line to data when both the x and y components have measurement error. This procedure is sometimes called "total least squares." Notice that there are error bars associated with both the horizontal and vertical components of the measurement point. The regression line is the best fit when it minimizes the sum of squares of perpendicular distances between measured points and the regression line itself, not simply the vertical distances between measured points and the regression line.

Figure 3:
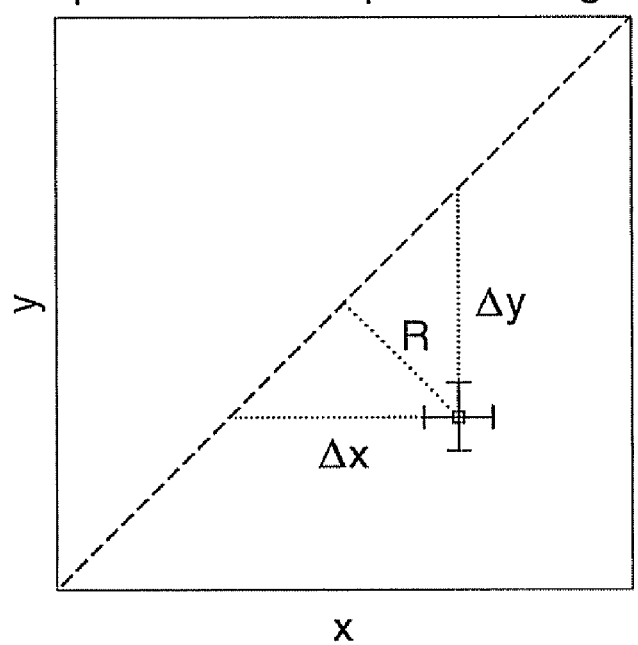
FIG. 3 illustrates several important distances between a data point and a regression line in the "total least squares" method.

FIG. 3 illustrates a representative example of perpendicular distance by denoting the distance between a measurement point and the regression line by R. Note that the slope of the regression line, which is what is desired to be computed, is $C=\Delta y/\Delta x$. Furthermore, if $\theta$ is defined as a tan(C), then $R=\Delta y \cos(\theta)$. Using the trigonometric identity that $$\cos(\theta) = \frac{1}{\sqrt{1+\tan^2(\theta)}},$$

and desiring to minimize the sum of squares of all perpendicular distances $R_i$ from points indexed by i to the regression line, the total cost J must be minimized, where $$J = \sum_i R_i^2 = \frac{1}{1+C^2}\sum_i (y_i - Cx_i)^2 \qquad (3)$$

To minimize J, 0 is set to ∂J/∂C and it is found that $$0 = \frac{1}{1+C^2}\sum_i -2(y_i - Cx_i)x_i - \frac{2C}{(1+C^2)^2}\sum_i (y_i - Cx_i)^2 \quad (4)$$

which may be written as a quadratic equation $$0 = s_2 C^2 + s_1 C + s_0$$

where $$s_2 = \sum_i x_i y_i, \quad s_1 = \sum_i x_i^2 - y_i^2, \text{ and } s_0 = -s_2.$$

The slope of the line may then be solved by computing the solution to a quadratic equation $$C = \frac{-s_1 + \sqrt{s_1^2 + 4s_2^2}}{2s_2} \quad (5)$$

Note that since $s_0 = -s_2$ there is no need to compute both terms independently.

Generalizing this to the case with unequal errors $\Delta y$ and $\Delta x$ is straightforward: it merely involves pre-scaling they values by multiplying by some constant K so that the errors are equal, computing a preliminary value of the slope C', and computing a final value of the slope as C=C'K. (A similar and equivalent procedure pre-scales the x values instead). Furthermore, generalizing to the case where different data points are given different confidence levels is straightforward. Furthermore, the math lends itself very naturally to a recursive algorithm for estimating the slope of the total least squares regression line, as will be described in a number of exemplary embodiments, below.

In one exemplary embodiment, the computer receives a first estimate of the battery cell SOC, $z(t_1)$, at a first time, $t_1$. Furthermore, it receives a second estimate of the battery cell SOC, $z(t_2)$, at a second time $t_2$. It computes $x=z(t_2)-z(t_1)$. It measures an integrated battery cell current $$y = \int_{t_1}^{t_2} \eta i(t) \, dt.$$

Figure 4:
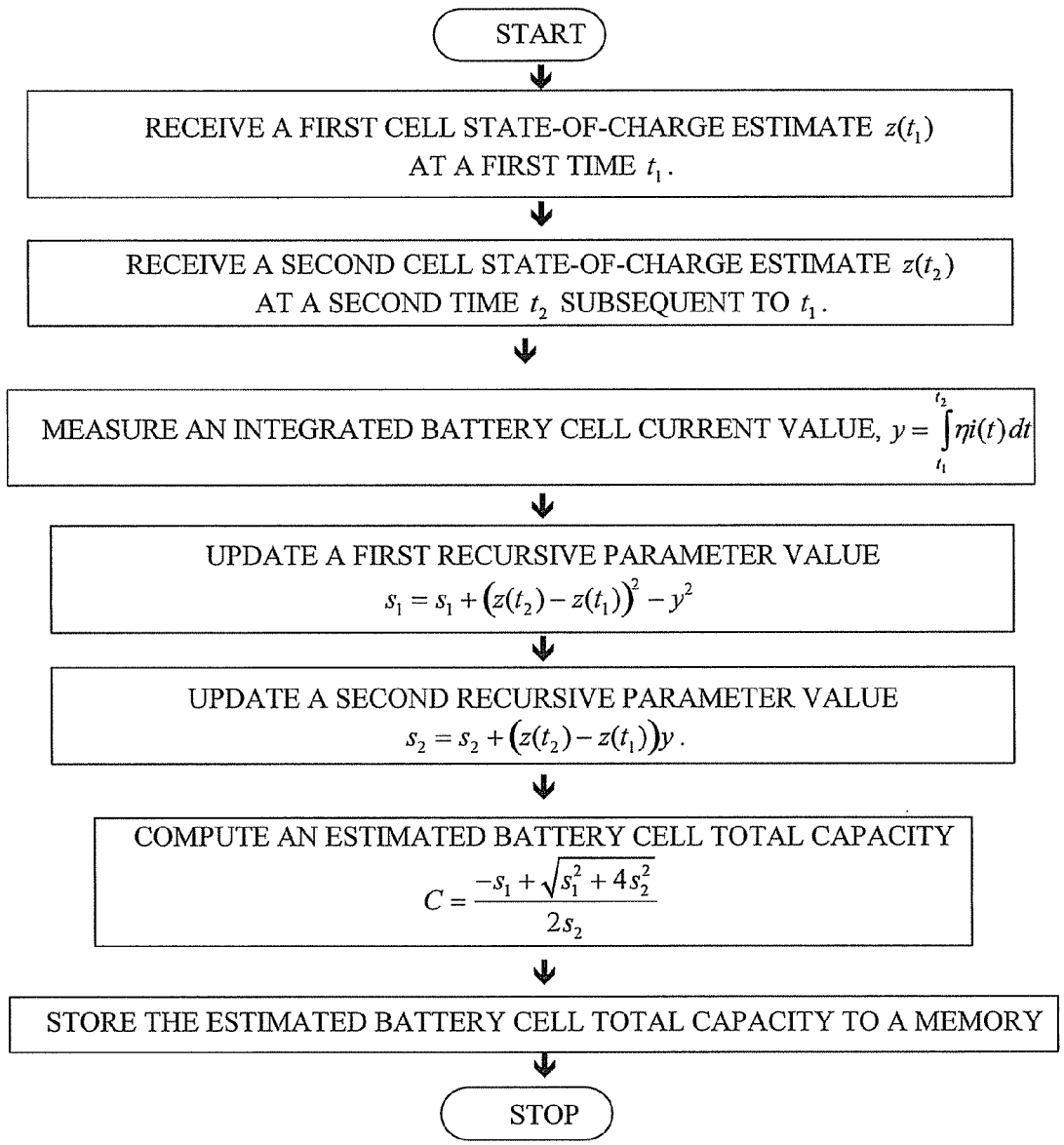
FIG. 4 is a block diagram of an exemplary computational algorithm utilized by the system of FIG. 1.

It updates a first recursive parameter $s_1 = s_1 + x^2 - y^2$ and updates a second recursive parameter $s_2 = s_2 + xy$. Finally, it computes an estimate of battery cell total capacity as $$C = \frac{-s_1 + \sqrt{s_1^2 + 4s_2^2}}{2s_2}$$

and stores that value in a memory. ($s_1$ and $s_2$ may be initialized to values indicative of a battery cell with nominal total capacity.) This exemplary embodiment is illustrated in FIG. 4.

In another exemplary embodiment, the first and second recursive parameters are instead computed as $s_1 = \alpha s_1 + x^2 - y^2$ and $s_2 = \beta s_2 + xy$, where $0 <= \alpha <= 1$ and $0 <= \beta <= 1$.

This has the effect of placing more emphasis on the most recent data samples and placing less emphasis on the oldest data samples, allowing the estimate of battery cell total capacity to adapt more quickly to a changing total capacity.

In another exemplary embodiment, a weighted battery cell current is computed as $$y = K \int_{t_1}^{t_2} \eta i(t) \, dt,$$

where K is chosen to make the errors in x and y of similar size. The recursive parameters are calculated as before, using this new definition for y, and an initial battery cell total capacity estimate is calculated as $$C' = \frac{-s_1 + \sqrt{s_1^2 + 4s_2^2}}{2s_2}.$$

The battery cell total capacity estimate is then computed as C=C'/K.

Figure 5:
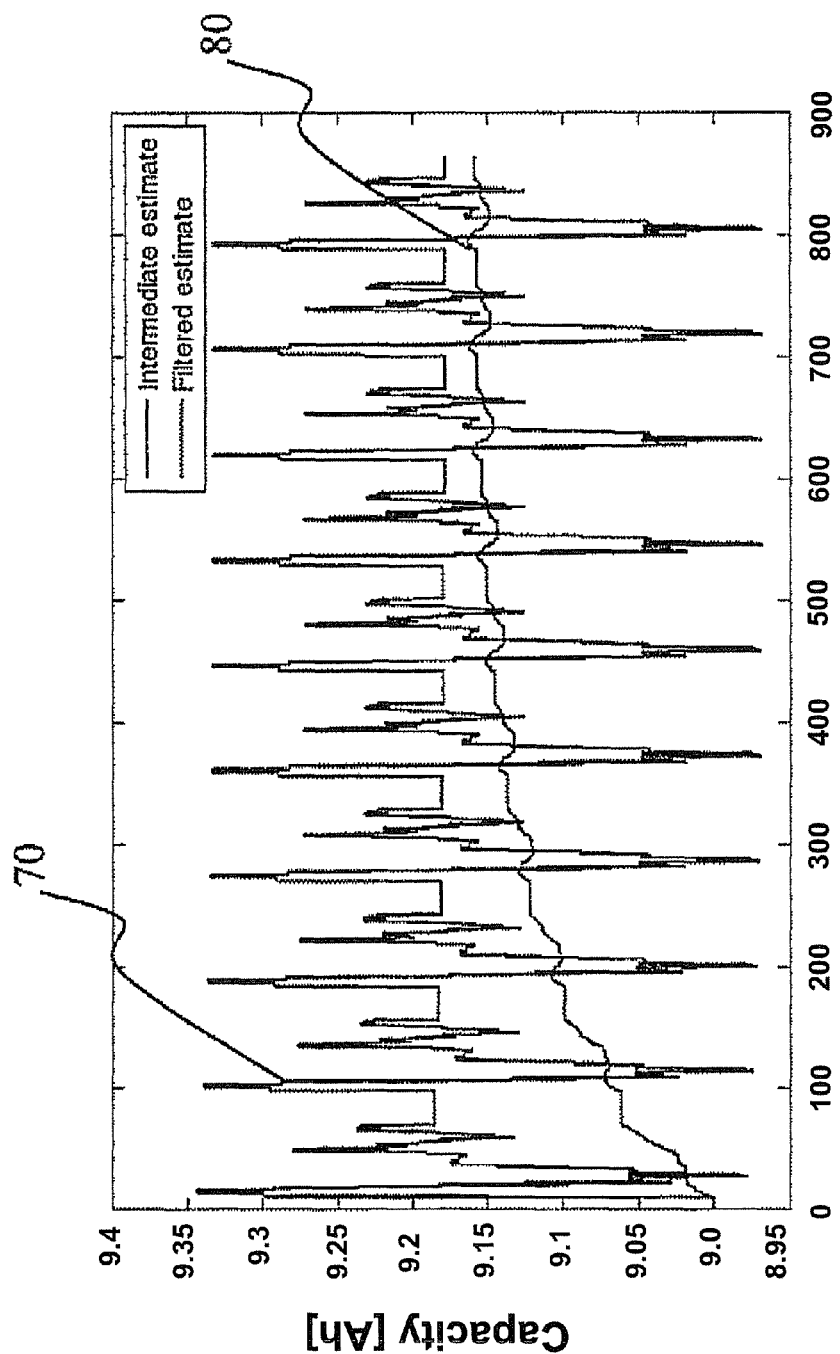
FIG. 5 is a result using an exemplary embodiment.

In yet another exemplary embodiment, individual sequential estimates of battery cell total capacity are computed and denoted as $C_k^{(i)}$. The sequence is indexed by variable k The corresponding battery cell total capacity estimate $C_k$ is then computed as $$C_k = \sum_{j=0}^{n_b} b_j C_{k-j}^{(i)} + \sum_{j=1}^{n_a} a_j C_{k-j} \quad (6)$$

where $a_j$, j=1L and $b_j$, j=1L $n_b$, are constants designed to implement a smoothing filter. FIG. 5 shows results using this exemplary embodiment. The line 70, referred to as the "intermediate estimate," shows initial capacity estimates $C_k^{(j)}$ over time for a lengthy battery test involving multiple full discharges from a fully charged state. The line 80, referred to as the "filtered estimate," shows battery cell total capacity estimates $C_k$ as the output of Eq. (6). In this particular example, an initial incorrect capacity estimate of 9.0 Ah is corrected to a value of 9.15 Ah in about 10 hours of driving. Since capacity is expected to change very slowly (perhaps 20 percent in a decade of use), this speed is more than sufficient.

The system and method for determining an estimated battery cell total capacity provides a substantial advantage over other systems and methods. In particular, the system and method provide a technical effect of accurately determining an estimated battery cell total capacity that is computationally efficient to compute, and does not impose operational constraints on how the battery cell is used when computing the estimate of battery cell total capacity.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The above-described methods can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an apparatus for practicing the methods. When implemented on a general-purpose microprocessor, the computer program code segments configure the microprocessor to create specific logic circuits.

While the invention is described with reference to exemplary embodiments, it will be understood by those skilled in the art that various changes may be made and equivalent elements may be substituted for elements thereof without departing from the scope of the invention. In addition, many modifications may be made to the teachings of the invention to adapt to a particular situation without departing from the scope thereof. Therefore, it is intended that the invention not be limited the embodiments disclosed herein, but that the invention includes all embodiments falling with the scope of the appended claims. Moreover, the use of the terms first, second, etc. does not denote any order of importance, but rather the terms first, second, etc. are used to distinguish one element from another.

What is claimed is:

1. A method for estimating a battery cell total capacity indicative of a total capacity of a battery cell, comprising:
   receiving a first battery cell state-of-charge estimate at a first time and receiving a second battery cell state-of-charge estimate at a second time subsequent to the first time;
   measuring an integrated battery cell current value indicative of an integrated battery cell current between the first time and the second time;
   updating at least one recursive parameter based on the first battery cell state-of-charge estimate, the second battery cell state-of-charge estimate, and the integrated battery cell current value;
   estimating, by using a computer, the battery cell total capacity based on said at least one recursive parameter; and
   storing a value corresponding to the estimated battery cell total capacity in a memory.

2. The method of claim 1, wherein updating at least one recursive parameter based on the first battery cell state-of-charge estimate, the second battery cell state-of-charge estimate, and the integrated battery cell current value comprises:
   computing a state-of-charge difference by subtracting the first battery cell state-of-charge estimate from the second battery cell state-of-charge estimate;
   updating a first recursive parameter by multiplying a prior value of the first recursive parameter by a first scaling factor between 0 and 1 (inclusive);
   further updating the first recursive parameter by adding the square of the state-of-charge difference and by subtracting the square of the integrated battery cell current value;
   updating a second recursive parameter by multiplying its prior value by a second scaling factor between 0 and 1 (inclusive); and
   further updating the second recursive parameter by adding the product of the state-of-charge difference and the integrated battery cell current value.

3. The method of claim 2, wherein the step of updating the second recursive parameter uses the relationship $s_2 = s_2 + (z(t_2) - z(t_1))y$.

4. The method of claim 1, wherein estimating a battery cell total capacity based on at least one recursive parameter comprises:
   receiving a first recursive parameter and a second recursive parameter; and solving a quadratic equation involving the first recursive parameter and the second recursive parameter to determine the estimated battery cell total capacity.

5. The method of claim 4, wherein the step of estimating the battery cell total capacity is governed by the equation $$C = \frac{-s_1 + \sqrt{s_1^2 + 4s_2^2}}{2s_2}.$$

6. The method of claim 4, wherein the first recursive parameter is governed by the equation $s_1 = \alpha s_1 + x^2 - y^2$, and the second recursive parameter is governed by the equation $s_2 = \beta s_2 + xy$, where $0 < \alpha < 1$ and $0 < \beta < 1$.

7. The method of claim 1, wherein determining the estimated battery cell total capacity based on at least one recursive parameter comprises:
   receiving a first recursive parameter and a second recursive parameter;
   solving a quadratic equation involving the first recursive parameter and the second recursive parameter to determine an initial battery cell total capacity estimate;
   determining a filtered battery cell total capacity estimate based on at least one of an initial battery cell total capacity estimate corresponding to a present or prior time and a filtered battery cell total capacity estimate corresponding to a prior time; and
   determining an estimated battery cell total capacity based on the filtered battery cell total capacity estimate.

8. The method of claim 1 where measuring an integrated battery cell current value indicative of the integrated battery cell current between the first time and the second time comprises:
   measuring an initial integrated battery cell current value indicative of the integrated battery cell current between the first time and the second time; and
   computing the integrated battery cell current by multiplying the initial integrated battery cell current value by a scaling constant.

9. The method of claim 1, wherein the step of measuring an integrated battery cell current value indicative of the integrated battery cell current between the first time and the second time uses the relationship $$y = \int_{t_1}^{t_2} \eta i(t)\, dt.$$

10. The method of claim 1, wherein the step of updating at least one recursive parameter based on the first battery cell state-of-charge estimate, the second battery cell state-of-charge estimate, and the integrated battery cell current value uses the relationship $s_1 = s_1 + (z(t_2) - z(t_1))^2 - y^2$.

11. A system for estimating a battery cell total capacity indicative of a total capacity of a battery cell, comprising:
    a computer configured to receive a first state-of-charge estimate at a first time;
    the computer configured to receive a second state-of-charge estimate at a second time, subsequent to the first time;
    a current sensor electrically coupled to the battery cell, the current sensor configured to generate a signal indicative of integrated battery cell current between the first and second times;

the computer configured to receive the first state-of-charge estimate, the second state-of-charge estimate, and the integrated battery cell current, the computer is further configured to update at least one recursive parameter based on the first state-of-charge estimate, the second state-of-charge estimate, and the integrated battery cell current, and to estimate the battery cell total capacity based on said at least one recursive parameter, the computer further configured to store a value corresponding to the estimated battery cell total capacity in a memory.

12. A non-transitory computer readable medium having computer-executable instructions for performing a method for estimating a battery cell total capacity indicative of a total capacity of a battery cell, the method comprising:

receiving a first battery cell state-of-charge estimate at a first time and receiving a second battery cell state-of-charge estimate at a second time subsequent to the first time;

measuring an integrated battery cell current value indicative of an integrated battery cell current between the first time and the second time;

updating at least one recursive parameter based on the first battery cell state-of-charge estimate, the second battery cell state-of-charge estimate, and the integrated battery cell current value;

estimating the battery cell total capacity based on said at least one recursive parameter; and storing a value corresponding to the estimated battery cell total capacity in a memory.

\* \* \* \* \*